United States Patent
Eckert et al.

(10) Patent No.: US 7,202,582 B2
(45) Date of Patent: Apr. 10, 2007

(54) ELECTRIC MACHINE WITH A CIRCUIT BOARD FOR WIRING LINES OF A WINDING SYSTEM

(75) Inventors: Rainer Eckert, Bad Neustadt/Herschfeld (DE); Jürgen Pawellek, Unsleben (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 11/074,296

(22) Filed: Mar. 7, 2005

(65) Prior Publication Data

US 2005/0194851 A1 Sep. 8, 2005

(30) Foreign Application Priority Data

Mar. 8, 2004 (EP) ................... 04005467

(51) Int. Cl.
*H02K 3/50* (2006.01)
*H02K 11/00* (2006.01)

(52) U.S. Cl. ..................... 310/71; 310/68 R
(58) Field of Classification Search ............. 310/68 R, 310/254, 71, DIG. 6, 89; 307/147; 174/261
See application file for complete search history.

(56) References Cited

U.S. PATENT DOCUMENTS

| | | | | |
|---|---|---|---|---|
| 4,810,917 A | * | 3/1989 | Kumar et al. | 310/68 R |
| 4,874,977 A | * | 10/1989 | Safranek | 310/269 |
| 5,256,922 A | * | 10/1993 | Tanaka et al. | 310/71 |
| 5,313,128 A | | 5/1994 | Robinson et al. | |
| 6,310,412 B1 | * | 10/2001 | Tamarkin | 307/147 |
| 6,545,379 B2 | * | 4/2003 | Gomyo | 310/68 R |
| 6,602,197 B2 | * | 8/2003 | Tahara | 600/459 |

FOREIGN PATENT DOCUMENTS

| | | |
|---|---|---|
| DE | 19 30 359 | 12/1970 |
| JP | 04317535 A * | 11/1992 |
| JP | 10174340 | 6/1998 |

* cited by examiner

*Primary Examiner*—Tran Nguyen
(74) *Attorney, Agent, or Firm*—Henry M. Feiereisen

(57) ABSTRACT

An electric machine includes a stator having a plurality of slots and a winding system having windings placed in the slots. The windings of the winding system are interconnected by at least one flexible circuit board which is constructed for attachment to a radial surface area of the stator and for connection to the windings.

12 Claims, 3 Drawing Sheets

ELECTRIC MACHINE WITH A CIRCUIT BOARD FOR WIRING LINES OF A WINDING SYSTEM

CROSS-REFERENCES TO RELATED APPLICATIONS

This application claims the priority of European Patent Application, Serial No. 04005467.8, filed Mar. 8, 2004, pursuant to 35 U.S.C. 119(a)–(d), the subject matter of which is hereby incorporated by reference.

BACKGROUND OF THE INVENTION

The present invention relates, in general, to an electric machine, and more particularly to a device for connecting winding leads of a winding system of an electric machine.

Nothing in the following discussion of the state of the art is to be construed as an admission of prior art.

Electric machines typically include a stator in the form of a stator core of stacked laminations. The stator core can have a star-shaped configuration and has slots for placement of at least one winding system constructed through tooth coil technology or exciter coil technology, involving a plurality of coil bobbins placed in the radial slots of the stator core, with each of the coil bobbins including an exciter coil winding of the winding system. To connect the individual coil windings, a circuit board is attached to an end surface of the end winding of the stator. Such a construction is disclosed in German patent publication no. DE 19 303 59. Depending on the type of winding system used, the circuit board is formed with feedthroughs for passage of the winding leads of the coil windings and their subsequent soldering to the circuit board.

The arrangement of the circuit board to the end surface of the stator suffers many shortcomings. The axial dimension of the electric machine is enlarged. Due to the circular configuration and the typical limitation of the diameter of the circuit board when attached to the radial dimension of the stator, the layout of the printed circuit wirings on the circuit board becomes progressively more complex, when the number of coil windings increases. Moreover, as the winding leads cannot be easily fixed in axial direction, the assembly of the electric machine becomes even more complicated and expensive.

It would therefore be desirable and advantageous to provide an improved electric machine to obviate prior art shortcomings and to allow simple and space-saving wiring of the winding system.

SUMMARY OF THE INVENTION

According to one aspect of the present invention, an electric machine includes a stator having a plurality of slots, a winding system having windings placed in the slots, and at least one flexible circuit board for connecting the windings of the winding system, wherein the circuit board is constructed for attachment to a radial surface area of the stator and for connection to the windings.

The present invention resolves prior art problems by mounting the circuit board to any one of the radial surface areas of the stator, such as the outer radial surface area or inner radial surface area of the stator core, or the outer radial surface or inner radial surface area of those parts of the coil bobbin of the stator that jut out beyond the stator core. As a consequence, the electric machine is compact and has overall minimum dimensions.

According to another feature of the present invention, the circuit board may have plural feedthroughs for passage of winding leads which jut out radially from the winding system and are adapted for soldering to the feedthroughs. The term "winding lead" relates hereby to the respective ends of a winding, i.e. the beginning of a winding or the end of a winding. As a result of this construction, the windings can easily be interconnected, thereby further simplifying the assembly of the electric machine. In other words, the flexible circuit board can be mounted in a most simple manner to any one of the radial surface areas because the radially projecting winding leads can easily be routed through the feedthroughs, when the flexible circuit board is wrapped about the surface area. The winding leads can then be soldered to the circuit board in any suitable manner known to the artisan so as to interconnect the various coil windings of the winding system.

As an alternative, or in addition to the feedthroughs, it is also possible to provide the circuit board with plural soldering points for soldering the winding leads which jut out radially from the winding system. Thus, especially after attachment of the circuit board, the winding leads can be bent and appropriately placed upon the soldering points for subsequent soldering thereto. This approach also contributes to a space-saving construction of the electric machine according to the invention.

According to another feature of the present invention, the circuit board may be constructed in the form of a multi-layer circuit board. This construction is suitable in particular when the electric machine is of small size while having many coil windings and thus many connections for the winding leads. The multi-layer circuit board allows interconnection of the windings of the winding system across several adjacent layers so that minimum space is used.

According to another feature of the present invention, a layer of electrically insulating material may be placed between the radial surface area of the stator and the circuit board, to provide electric insulation. In other words, the electrically insulating material may be disposed between the winding, the coil bobbins or the stator core, on one hand, and the circuit board, on the other hand. The layer of electrically insulating material may be configured in the form of a film. Another such layer may also be provided between the housing of the electric machine and the circuit board.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
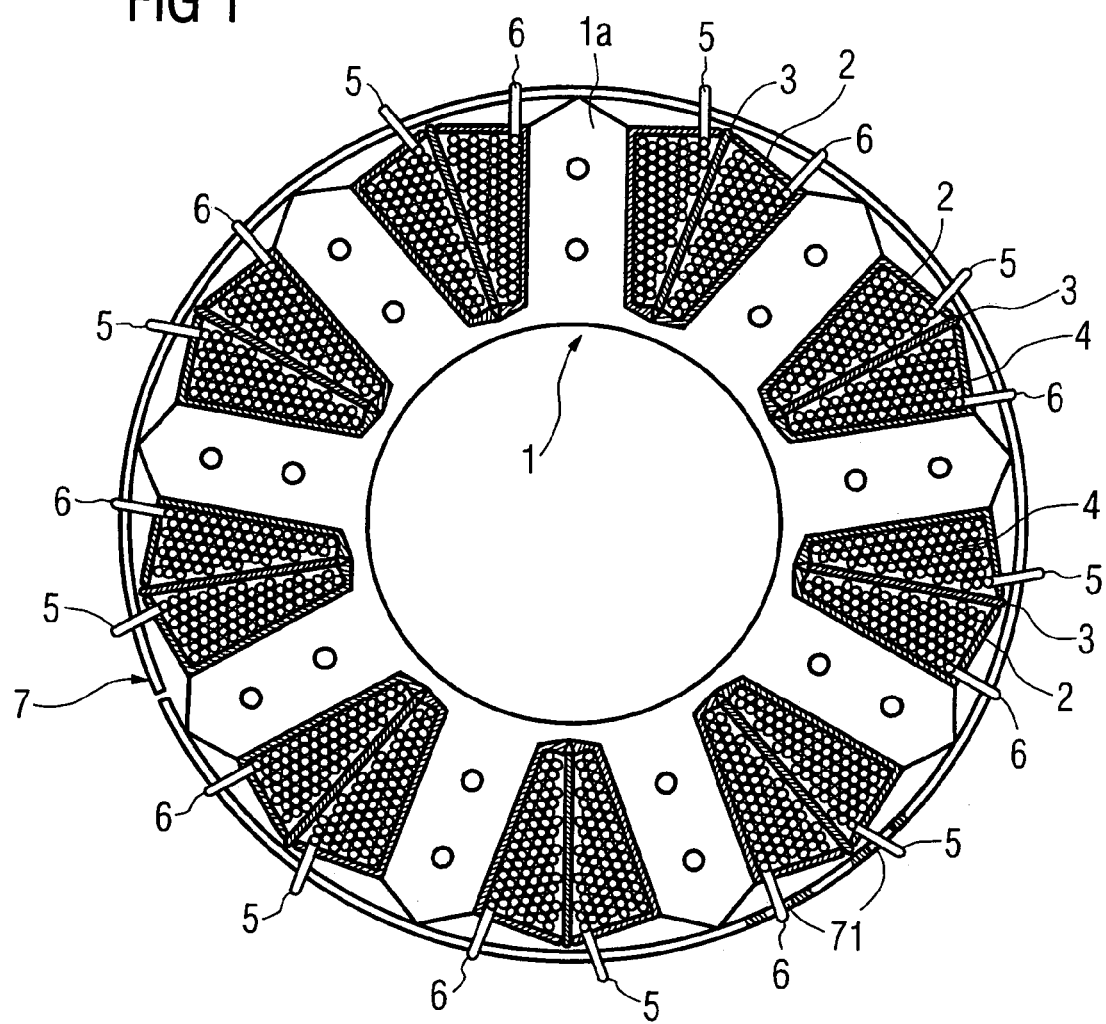
FIG. 1 is a sectional view of an electric machine having incorporated the subject matter of the present invention.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a sectional view of an electric machine having incorporated the subject matter of the present invention. The electric machine includes a stator, generally designated by reference numeral 1 and constructed in tooth coil technology or exciter coil technology. In the nonlimiting example of FIG. 1, the stator 1 includes a star-shaped stator core 1a constructed in the form of stacked laminations and having slots, each of which receiving two coil bobbins 2 which are separated by a phase separation 3. Each coil bobbin 2 carries a coil winding 4 that is wound appropriately for the electric machine at hand. The coil windings 4 are distributed about the circumference of the stator 1 and form together the winding system of the stator 1. The coil windings 4 have each winding leads 5, 6, representing the leading and trailing ends of the winding and interconnected in such a way that the electric machine is electrically excited during operation.

In accordance with the present invention, the interconnection of the windings leads 5, 6 is realized using a flexible circuit board 7 which is attached to one of the radial surface areas of the stator 1. A surface area is hereby defined by the inner or outer dimensions of the stator core 1a or by the inner or outer dimensions of parts of the radial coil bobbins 2 which jut out. As shown by way of example in FIG. 1, the flexible circuit board 7 may be wrapped in a radial plane about or to the outer surface area of the stator core 1a. As an alternative, or in addition, a circuit board 7 may be placed upon the inner surface area which extends on a side of the stator core 1a in confronting relationship to the stator axis, or also about the outer or inner sides of those parts of the radial coil bobbins 2 which jut out.

The circuit board 7, shown here about the outer surface area of the stator core 1a upon the projecting parts, includes a plurality of feedthroughs 71 which are so disposed that the winding leads 5, 6, radially projecting out from the coil windings 4 of the winding system, can be routed through the feedthroughs 71, when the circuit board 7 is attached. As the winding leads 5, 6 can be precisely positioned in radial direction through radial slits in the coil bobbins 2, the circuit board 7 can be easily rolled over the surface area of the stator core 1a during assembly of the electric machine. Thus, the assembly can be executed in a substantially fully automated fashion. As the circuit board 7 can be directly attached to one of the surface areas of the stator core 1a, there is no need for an additional device for mechanically securing the circuit board 7 in the electric machine. In addition, strain based on shaking, impact or temperature can be minimized.

The flexible circuit board 7 has typically a configuration that corresponds to the shape of the stator 1, i.e. a rectangular configuration. The whole area of the circuit board 7 is thus available for printing the necessary electrically conductive pathways. In the event, the implementation of a simple wiring of the printed pathways in the absence of crossovers is not possible or too complicated to achieve on one layer of the circuit board 7, it is, of course, possible to use a multi-layer circuit board 7 that has several adjacent layers.

Figure 2:
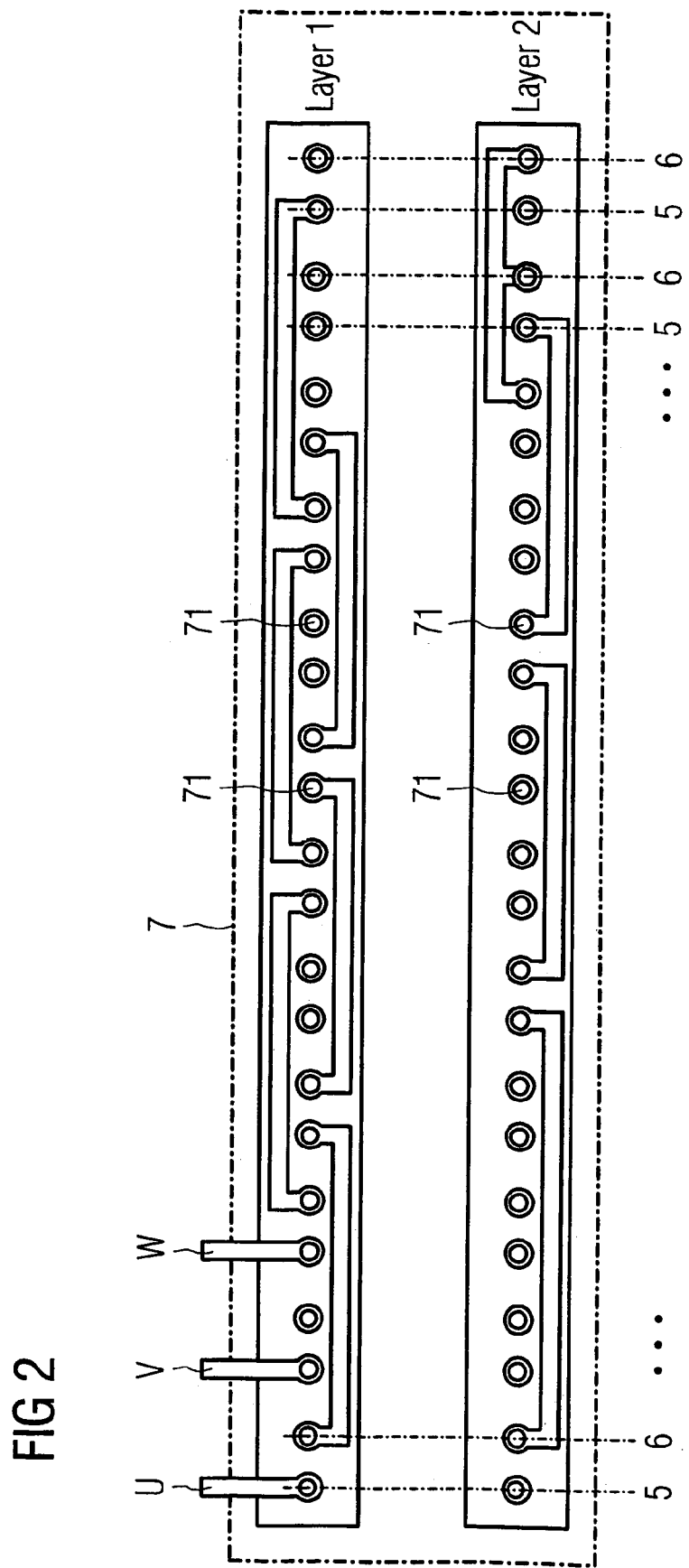
FIG. 2 a schematic illustration of a possible wiring pattern of a printed circuit of a multi-layer circuit board for interconnecting winding leads of a winding system.

FIG. 2 shows by way of example such a multi-layer circuit board 7 having two layers 1, 2 for printing the electrically conductive pathways between the winding leads 5, 6. The pathways are hereby printed on the topside and bottom side of the circuit board 7 in the form of a circuit pattern which is suitable for connecting the arrangement of the coil windings 4 of the winding system, as shown in FIG. 1, in a star-shaped manner. The respective winding leads 5, 6 of the coil windings 4 are routed through the feedthroughs 71 and subsequently soldered to the circuit board 7. The thus wired coil windings 4 via the pathways printed on the circuit board 7 are connected for electric excitation of the electric machine during operation via respective lead wires U, V, and W for the individual current phases.

Figure 3:
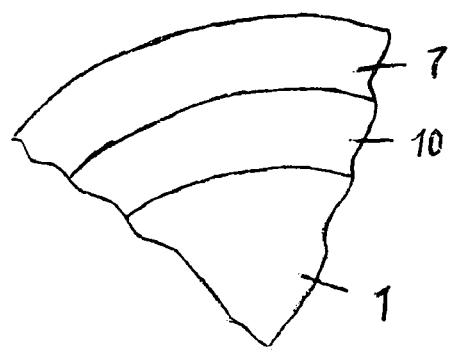
FIG. 3 is a schematic illustration of a variation of the electric machine with incorporated insulation.
Figure 4:
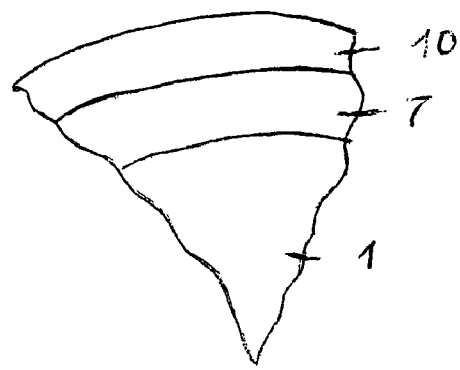
FIG. 4 is a schematic illustration of another variation of the electric machine with incorporated.
Figure 5:
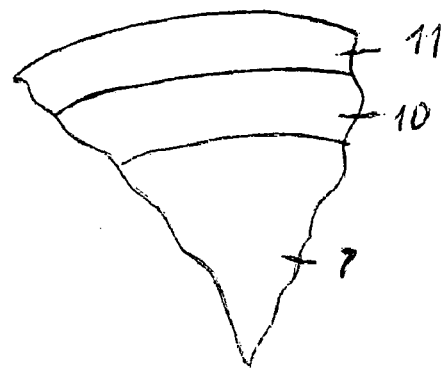
FIG. 5 is a schematic illustration of still another variation of the electric machine with incorporated insulation.

As shown in FIG. 3, a layer 10 of electrically insulating material may be placed between the radial surface area of the stator 1 and the circuit board 7, to provide electric insulation. In other words, the electrically insulating material may be disposed between the winding, the coil bobbins or the stator core, on one hand, and the circuit board, on the other hand. A layer 10 of electrically insulating material can also be attached to a stator-distal side of the circuit board 7, as shown in FIG. 4. The layer 10 of electrically insulating material may be configured in the form of a film. Another such layer 10 may also be provided between a housing 11 of the electric machine and the circuit board 7, as shown in FIG. 5.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated. For example, it is, of course, within the scope of the present invention to provide the circuit board 7, instead or in addition to the feedthroughs 71, with soldering points (not shown in detail) for contributing to a space-saving construction of the electric machine. In this case, after the circuit board 7 has been attached to the surface area of the stator core 1a, the winding leads 5, 6 are bent about the circuit board 7 and then soldered to the respective soldering points. Depending on the complexity of the winding system and the space available for the circuit board 7, the application of a correspondingly complex flexible multi-layer circuit board of more than two layers, is, of course, also conceivable. The winding leads 5, 6 are hereby connected to the circuit board 7 in a same manner, as described above. The single layers of the circuit board are connected to one another by suitable through-contacts so as to establish a three-dimensional circuit pattern of the multi-layer circuit board.

What is claimed is:

1. An electric machine, comprising:
a stator having a plurality of slots;
a winding system having windings placed in the slots; and
at least one flexible circuit board having printed pathways for connecting the windings of the winding system with one another, said circuit board being constructed for attachment to a radial surface area of the stator and for connection to the windings, said circuit board having a contact assembly connected to the windings for supply of electric energy to individual current phases via respective lead wires of each phase winding.

2. The electric machine of claim 1, wherein the circuit board has plural feedthroughs for passage of winding leads which jut out radially from the winding system and are adapted for soldering to the circuit board.

3. The electric machine of claim 2, wherein the feedthroughs are constructed as a hole and/or slit.

4. The electric machine of claim 1, wherein the circuit board includes plural soldering points for soldering winding leads which jut out radially from the winding system.

5. The electric machine of claim 1, wherein the circuit board is constructed in the form of a multi-layer circuit board.

6. The electric machine of claim 1, wherein the stator has a stator core in the form of stacked laminations, said circuit board being attached to the stator core about its outer radial surface area and/or inner radial surface area.

7. The electric machine of claim 1, wherein the stator has a stator core in the form of stacked laminations and includes coil bobbins placed radially in the slots and have parts projecting beyond the stator core, said circuit board being attached to the parts about their outer radial surface area and/or inner radial surface area.

8. The electric machine of claim 1, and further comprising a layer of at least electrically insulating material placed between the radial surface area of the stator and the circuit board.

9. The electric machine of claim 1, and further comprising a layer of at least electrically insulating material attached to a stator-distal side of the circuit board.

10. The electric machine of claim 1 and further comprising a housing in surrounding relationship to the stator, and a layer of at least electrically insulating material placed between the housing and the circuit board.

11. The electric machine of claim 1, wherein the stator is constructed through tooth coil technology.

12. The electric machine of claim 1, wherein the stator is constructed through exciter coil technology.

* * * * *